United States Patent [19]
Renda

[11] Patent Number: 5,107,202

[45] Date of Patent: Apr. 21, 1992

[54] FIBER OPTIC CURRENT MONITOR FOR HIGH-VOLTAGE APPLICATIONS

[75] Inventor: George F. Renda, Plainsboro, N.J.

[73] Assignee: Trustees of Princeton University, Princeton, N.J.

[21] Appl. No.: 425,800

[22] Filed: Oct. 23, 1989

[51] Int. Cl.$^5$ .............................................. G01R 15/02
[52] U.S. Cl. ...................................... 324/96; 324/126
[58] Field of Search ................. 324/96, 123 R, 110, 324/126, 127; 330/59, 308

[56] References Cited

U.S. PATENT DOCUMENTS

| | | | |
|---|---|---|---|
| 2,724,821 | 11/1955 | Schweitzer Jr. | 324/127 |
| 3,183,446 | 5/1965 | Richman | 324/110 |
| 4,066,973 | 1/1978 | McNally | 324/59 |
| 4,070,572 | 1/1978 | Summerhayes | 250/199 |
| 4,091,432 | 5/1978 | Muller | 324/110 |
| 4,163,950 | 8/1979 | Damm et al. | 330/308 |
| 4,754,219 | 6/1988 | Milkovic | 324/142 |
| 4,780,668 | 10/1988 | Tai et al. | 324/126 |
| 4,886,980 | 12/1989 | Fernandes et al. | 324/126 |

OTHER PUBLICATIONS

"Signal Powered Fiber Optic Modem", LDM80, Burr-Brown Corp., 1986.

*Primary Examiner*—Ernest F. Karlsen
*Attorney, Agent, or Firm*—Kenneth Watov

[57] ABSTRACT

A current monitor which derives its power from the conductor being measured for bidirectionally measuring the magnitude of current (from DC to above 50 khz) flowing through a conductor across which a relatively high level DC voltage is applied, includes a pair of identical transmitter modules connected in opposite polarity to one another in series with the conductor being monitored, for producing from one module a first light signal having an intensity directly proportional to the magnitude of current flowing in one direction through the conductor during one period of time, and from the other module a second light signal having an intensity directly proportional to the magnitude of current flowing in the opposite direction through the conductor during another period of time, and a receiver located in a safe area remote from the high voltage area for receiving the first and second light signals, and converting the same to first and second voltage signals having levels indicative of the magnitude of current being measured at a given time.

19 Claims, 5 Drawing Sheets

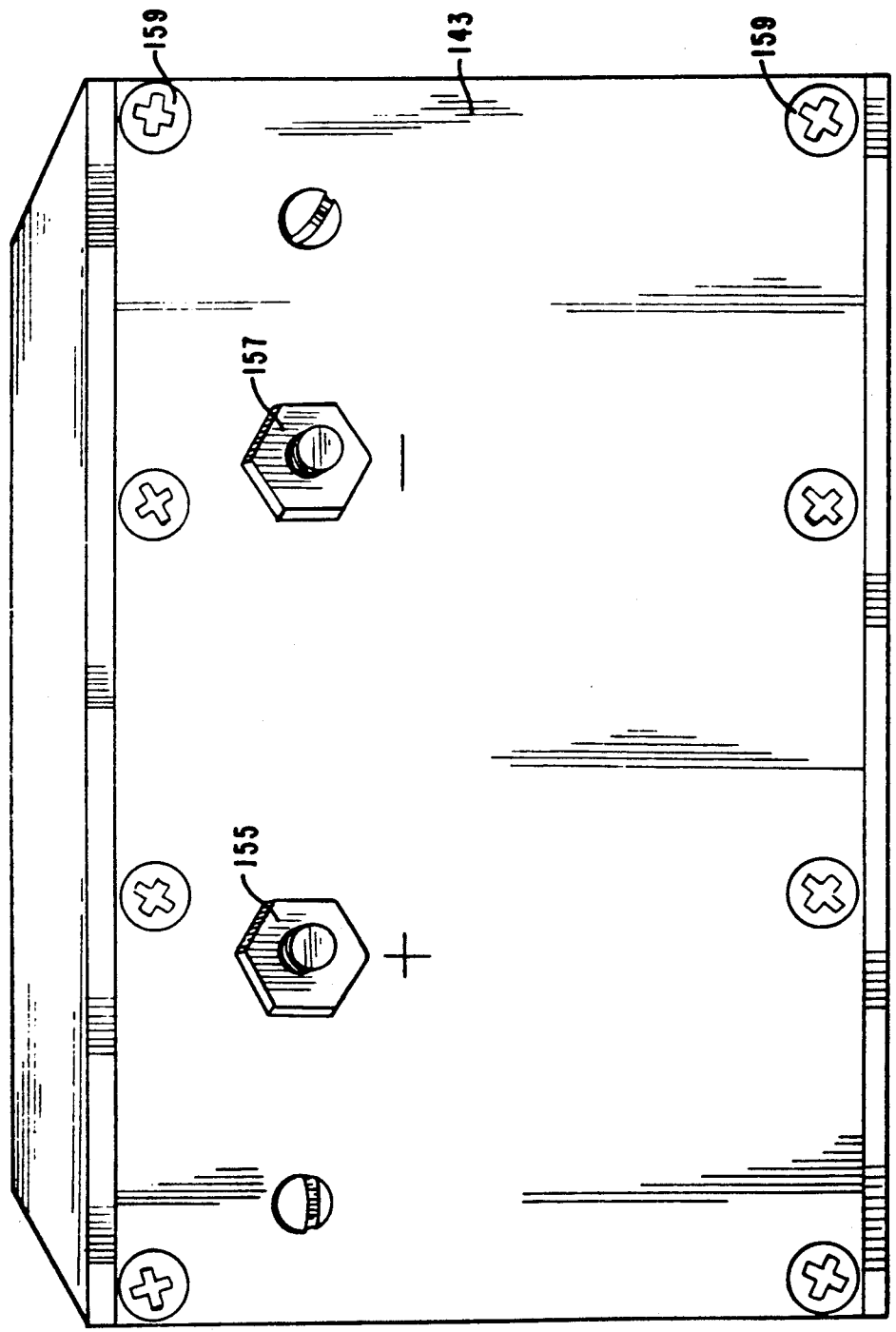

FIBER OPTIC CURRENT MONITOR FOR HIGH-VOLTAGE APPLICATIONS

GOVERNMENT RIGHTS

This invention was made with Government support under contract DE-AC02-76CH03073 awarded by the Department of Energy. The Government has certain rights in this invention.

FIELD OF THE INVENTION

The field of the present invention relates generally to current monitors, and more specifically to self-powered current monitors for measuring the magnitude of current flowing through a circuit across which a relatively high voltage is applied.

BACKGROUND OF THE INVENTION

In many applications, including the fields of fusion reactors, radio frequency systems, and telemetry systems, for example, it is often necessary to measure the magnitude of current flowing through circuits across which high voltages are applied, for example.

One particular example of such a system involves the Tokamak Fusion Test Reactor (TFTR) located in the Plasma Physics Laboratory, at Princeton University. In operating the TFTR, it is necessary to monitor the magnitude of the current in the neutral beam gradient grid. Typically, currents of less than 1.0 ampere ranging from the low to high milliamperes in magnitude, at voltages of about 100.0 kilovolts DC, must be measured. Current monitors utilized must be capable of withstanding high levels of transient voltage, and provide a means of safely measuring relatively low-magnitudes of current in the presence of relatively high-voltage levels, without requiring the use of high-voltage isolated power supplies or batteries.

There have been many systems developed in the prior art for measuring the magnitude of current flowing in circuits across which a relatively high voltage is applied. A number of these prior systems are discussed below.

In Summerhayes U.S. Pat. No. 4,070,572 (hereinafter Summerhayes), as shown in FIG. 1, a current monitor circuit for an ac high voltage line 100 includes a shunt 101 which is used to derive an alternating current signal proportional to the current flow in the ac line 100. The signal is coupled through a resistor R102 and capacitor C106 to the inverting terminal of an amplifier A103, the output terminal of which is connected to the base electrode of a current amplifying transistor Q. The PNP transistor Q delivers current to an LED 105, which responds by emitting a light or optical signal that is proportional in intensity to the magnitude of current flowing through the ac line 100. A photodiode PD1, connected across the inverting and noninverting terminals of the amplifier A103, provides negative feedback for causing the output of the light-emitting diode to vary as a linear function of the magnitude of the input signal into the amplifier A103. The light output from the LED 105 is coupled through a fiber optic cable 110 to a photo detecting diode PD2 of a remotely located receiver. Variable negative feedback is provided via a variable resistance cell R202 connected between the inverting and output terminals of amplifier A201, and to the output terminal of amplifier A203. The latter has an inverting input terminal connected to the output terminal of amplifier A201. A low pass filter circuit is provided by the combination of resistors R204, R205, and the capacitor C206. A dc reference voltage is applied to the noninverting terminal of amplifier A203, whereby this reference voltage has the same level as a DC reference voltage applied to one end of resistor R104 of the transmitter circuit. These reference voltages, and the variable negative feedback provided by R202 compensate for drift in the characteristics of the photodiodes PD1 and PD2.

Summerhayes also teaches in FIG. 2 an alternative receiver that includes an analog multiplier element M202 for controlling the gain of the receiver with less distortion than can be provided using the variable resistance cell R202 of FIG. 1. Yet another alternative receiver circuit is shown in FIG. 3, whereby an error signal derived from a comparison of the dc reference signal $V_{ref2}$ with the dc component in the received signal relative to amplifier A203, is fed to a motor 210 for driving a lead screw 212 to vary the distance between the end of the fiber optic cable 110a and the photodiode PD2. A power supply 106 that derives power from the ac high voltage line 100 via a transformer coupling 107 is also included.

Milkovic U.S. Pat. No. 4,754,219 (hereinafter Milkovic), teaches the use of thin film ferromagnetic current sensors for detecting the current flowing through an ac line, and providing electrical isolation between the power conductors and the current sensing circuitry. The current signals are amplified and processed for providing the watt hours of power flowing through the three-phase conductors shown in FIG. 2 of Milkovic.

Nguyen Tan Tai et al. U.S. Pat. No. 4,780,668, discloses a circuit for measuring current signals of substantially small magnitude at voltages up to several kilovolts. The low level signals are amplified at the high potential, converting the signal to a potential at ground reference, for measuring the level of the same which is proportional to the current flowing through the main conductor of the system being monitored.

SUMMARY OF THE INVENTION

An object of the present invention is to provide a current monitor for use in high voltage applications that will measure current information over a wide frequency range (dc to above 50 Khz).

Another object of the invention is to provide an improved current monitor housed a self contained module that derives its power from the current being monitored.

Another object of the invention is to provide an improved current monitor for high-voltage applications that can withstand relatively high transient voltages while providing a relatively high level of linearity in measuring the magnitude of current flowing through the circuit being monitored.

Yet another object of the invention is to provide an improved current monitor for high-voltage applications that is capable of the bidirectional measurement of the magnitude of current flowing through the circuit being monitored, whereby the relatively high voltage applied across the circuit being monitored is a DC voltage.

These and other objects of the invention are provided in one embodiment in a circuit module connecting in series with the instrumented conductor or cable being monitored, wherein the module includes transient voltage protection means for shunting away from the current monitor excessively high magnitudes of current produced by transient voltages, a first transmitter submodule for measuring the magnitude of current flowing in one direction, coupled to a second submodule for monitoring the flow of current in the opposite direction, wherein each submodule includes power supply means for producing necessary operating voltages for the monitor from the current being monitored, current magnitude sampling means for developing a voltage having a level corresponding to the magnitude of current flowing through the conductor being monitored, and voltage-to-current conversion means for converting a sampled voltage signal to a current signal for application to a light emitting diode means for producing a beam of light having an intensity proportional to the magnitude of the sampled current signal; a receiver module located remotely from the high-voltage area being monitored, includes first receiver means for detecting the beam of light from the first transmitter submodule, and converting the same to a voltage signal indicative of the magnitude of current flowing in one direction through the circuit or conductor being monitored, and second receiving means for detecting and converting a beam of light from said second transmitter submodule to a corresponding voltage signal indicative of the magnitude of current flowing in the opposite direction.

BRIEF DESCRIPTION OF THE DRAWINGS

Various preferred embodiments of the invention are described below with reference to the drawings in which like items are indicated by the same reference designation, wherein:

FIG. 6 shows a back view of the housing for the one embodiment of the present invention of FIG. 5.

DETAILED DESCRIPTION OF PREFERRED EMBODIMENTS OF THE INVENTION

Figure 1:
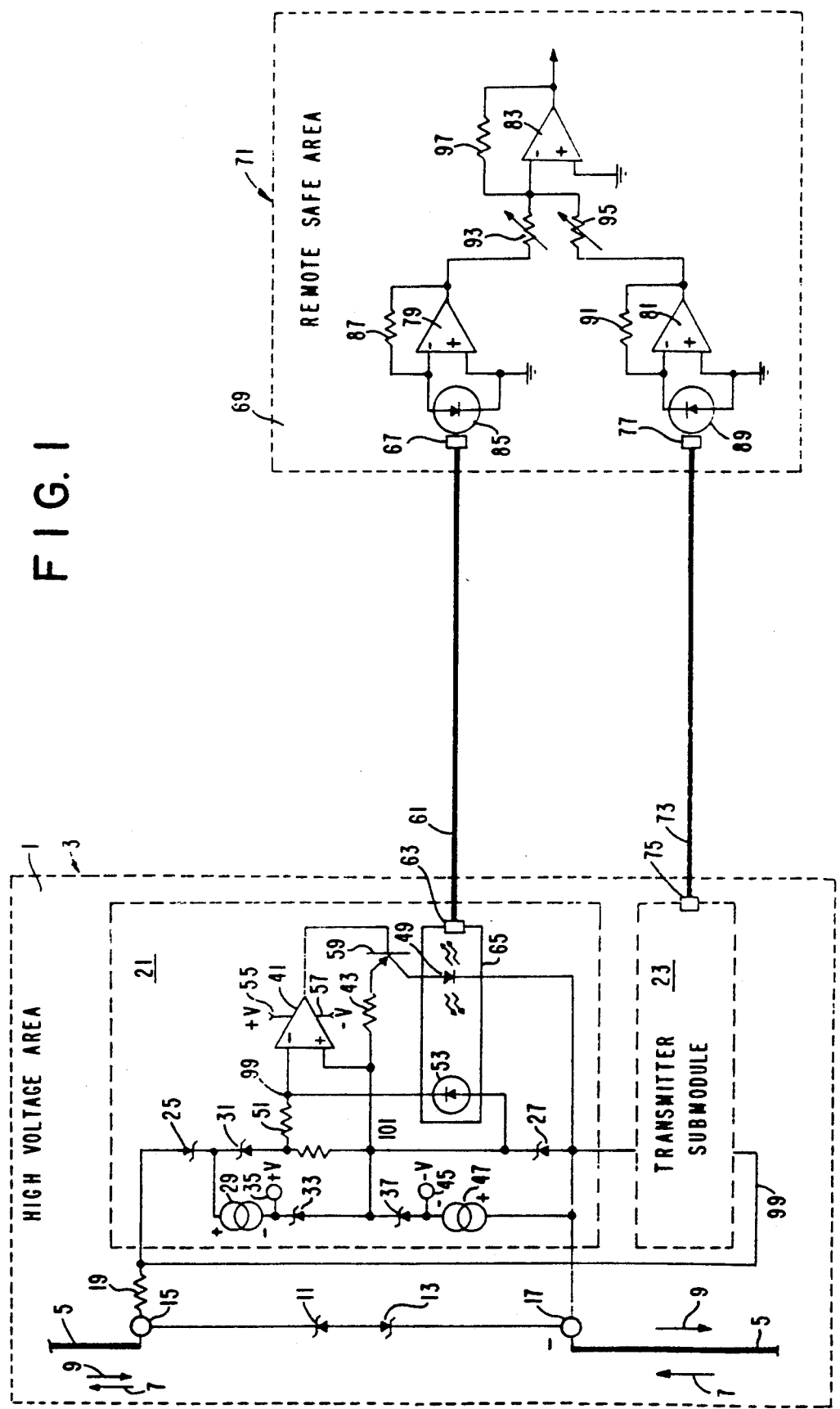
FIG. 1 is a simplified block-schematic diagram of one embodiment of the invention.

With reference to FIG. 1, the present invention includes a transmitter module 1 located in a high-voltage area 3. As shown, the transmitter module 1 is connected in series with an instrumented conductor 5, in this example, for monitoring the magnitude of current flowing through conductor 5 in either direction as indicated by the arrows 7 and 9. A pair of Transorbs 11 and 13 are connected in series between terminals 15 and 17 of transmitter module 1, and as a result are directly in series with the instrumented conductor 5. In this example, the Transorb devices are each part number 15KP22A, manufactured by General Semiconductor Industries, Tempe, Ariz., are used to protect against over current conditions, caused by transient voltages across the instrumented conductor 5, which transient voltages may cause the current to exceed 1.0 ampere, and even go as high as hundreds of amperes for relatively short transient periods of time. A monitoring resistor 19 is connected between terminal 15 and the input to the transmitter module 1, whereby transient voltages will cause a relatively high voltage to develop across resistor 19, in turn causing the Transorbs 11 and 13 to breakdown, for conducting the resultant transient currents away from the transmitter module 1, and back down along the instrumented conductor 5. In this manner, the maximum current that the transmitter module 1 undergoes or conducts is limited to less than an ampere.

The transmitter module 1 further includes a first submodule 21 for monitoring the magnitude of current flowing through the instrumented conductor in the direction indicated by the arrow 9, and a second identical submodule 23 for monitoring the magnitude of current flowing through the instrumented conductor in the direction of the arrow 7, in this example. For purposes of illustration, assume that a current is flowing in the direction of the arrow 9.

Submodule 21 includes a blocking diode 25 having an anode electrode connected in common to one end of resistor 19, and the anode electrode of a zener diode 27 located in transmitter submodule 23. The cathode electrode of blocking diode 25 is connected in common to one end of a current regulator 29, and the cathode electrode of a zener diode 31. The other end of current regulator 29 is connected to the cathode electrode of a zener diode 33, and a voltage terminal 35 for providing a supply voltage +V to the submodule 21 circuit elements. The anode electrode of zener diode 33 is connected in common to the cathode electrode of a zener diode 37, one end of a current sampling resistor 39, the non-inverting terminal of an operational amplifier 41, and one end of an emitter resistor 43. The anode electrode of zener diode 37 is connected in common to a voltage terminal 45 for a negative supply voltage —V for submodule 21, and to one end of another current regulator 47. The other end of current regulator 47 is connected in common to input terminal 17, the anode electrode of zener diode 27, and the cathode electrode of light emitting diode 49. Note also that this latter common connection is also connected to the anode electrode of diode 25 of submodule 23.

The common connection of zener diode 31 and sampling resistor 39 is also connected to one end of an input resistor 51, the other end of which is connected in common to the inverting terminal of operational amplifier 41 and the cathode electrode of photodiode 53. The anode electrode of photodiode 53 is connected in common to the cathode electrode of zener diode 27, and the non-inverting terminal of amplifier 41, and other components as previously described. Operational amplifier 41 has power terminals 55 and 57 for connection to voltage terminals 35 and 45, respectively, and also has an output terminal connected to the base electrode of a PNP transistor 59. Transistor 59 has an emitter electrode connected to the other end of emitter resistor 43, and a collector electrode connected to the anode electrode of a light emitting diode 49. A fiber optic cable 61 is connected at one end to a fiber optical coupling 63 located on a housing 65 enclosing photodiode 53 and light emitting diode 49, as shown. The other end of fiber optic cable 61 is connected to a fiber optical coupler 67 located in a receiver module 69. The receiver module 69 is located in a safe area 71 remote from the high-voltage area 3. Another fiber optic cable 73 is connected between transmitter submodule 23 and receiver module 69. One end of the fiber optic cable 73 is connected to a fiber optical coupler 75 of submodule 23, and the other end to another fiber optical coupler 77 within receiver module 69, as shown.

The receiver module 69 includes three operational amplifiers 79, 81, and 83. A photodiode 85 is connected with its anode electrode to the inverting terminal of operational amplifier 79, and its cathode electrode connected in common to a source of reference potential, ground in this example, and the noninverting terminal of operational amplifier 79. A feedback resistor 87 is connected between the inverting and output terminals of operational amplifier 79. Another photodiode is connected with its cathode and anode electrodes between the inverting and non-inverting terminals, respectively, of operational amplifier 81. The non-inverting terminal of operational amplifier 81 is also connected to a source of reference potential, ground in this example. A feedback resistor 91 is connected between the inverting and output terminals of operational amplifier 81. A pair of trimming resistors or potentiometers 93 and 95 have one end of each connected in common to the inverting terminal of operational amplifier 83, and to one end of a feedback resistor 97, the other end of the latter being connected to the output terminal of operational amplifier 83. The other ends of potentiometers 93 and 95 are connected to the output terminals of operational amplifiers 79 and 81, respectively. The non-inverting terminal of operational amplifier 83 is connected to a source of reference potential, ground in this example.

Zener diode 31, in this example, insures that approximately 5.0 volts is available for driving current regulator 29, and breaking down zener diode 33, for obtaining a positive supply voltage +V of about +2.4 volts to power operational amplifier 41. Similarly, zener diode 27, in this example, provides about +7.4 volts for breaking down zener diode 37 and driving current regulator 47, to obtain a negative supply voltage −V having a level of about −5.1 volts at terminal 45. Accordingly, power for the transmitter module 1 is derived internally from the current being monitored via the previously described combination of components for providing the supply voltages +V at terminal 35, and −V at terminal 45.

Operational amplifier 41 is configured as a virtual ground operational amplifier circuit. A virtual ground is provided at node 99 formed from the common connection of photodiode 53, resistor 51, and the inverting terminal of operational amplifier 41. Note that the photodiode 53 conducts microampere levels of current for cancelling currents about node 99 to maintain the virtual ground at that node 99. Also, a zero volt node is provided at nodal point 101.

When the output voltage from operational amplifier 41 attains a sufficient negative level, PNP transistor 59 responds by turning on for providing a current source. In this manner, transistor 59 is a voltage-to-current converter. When transistor 59 turns on, current flows from sampling resistor 39 through emitter resistor 43 and the emitter-collector current path of transistor 59, to the light emitting diode 49. The light emitting diode 49 responds to this current by emitting light having an intensity corresponding to the magnitude of current flowing therethrough. Photodiode 53 responds to the intensity level of the light so emitted, by producing a photon induced current between its cathode and anode electrode, thereby providing a path for the current from R51. A portion of the current flowing through resistor 39 flows through emitter resistor 43, transistor 59, and light emitting diode 49. Since amplifier 41 is connected in a virtual ground configuration, the current through resistor 51 is proportional to the current through resistor 39. The current through resistor 51 must flow through photodiode 53 which is accomplished by forcing (via closed loop) light emitting diode 49 to emit enough light to allow photodiode 53 to pass all of the current from resistor 51. Note that the light from the light emitting diode 49 is split between photodiode 53 and a fiber optic output port associated with fiber optic coupling 63. Since photodiode 53 produces current linearly proportional to the amount of light it absorbs, the intensity of light transmitted through the fiber is linearly proportional to the amount of current flowing through sampling resistor 39.

In operation of the embodiment of the invention of FIG. 1, as partially described above, the transmitter module 1 is connected in series with the conductor 5 to be current monitored via terminals 15 and 17. Current derived from conductor 5, in this example flowing into terminal 15, establishes the power supply voltages +V and −V at terminals 35 and 45, respectively, as previously described. Once these voltages are established, any current in excess of the magnitude of current necessary to establish the voltages +V and −V, primarily flows through resistor 39, in that the resistance of input resistor 51 is in this example 49.9 kilohms, whereas sampling resistor 39 has a resistance of only 1.0 ohm, in this example. The voltage developed across the sampling resistor 39, and input resistor 51, is for each proportional to the magnitude of current flowing through sampling resistor 39. The voltage output of operational amplifier 41 goes negative in correspondence to the level of voltage produced across sampling resistor 39. This negative output voltage from amplifier 41 is applied to the base electrode of PNP transistor 59, causing this transistor to turn on or conduct. When transistor 59 so turns on, the impedance between its collector and emitter electrodes substantially reduces, permitting current to flow through the light emitting diode 49 of the photo-optical feedback circuit 65, and therefrom to terminal 17 for return to the conductor 5.

It is important to note that in the embodiment of the present invention shown in FIG. 1, the transmitter submodule 21 circuitry is arranged for providing that the current flowing through the sampling resistor 39 is partly used for supplying the magnitude of current necessary to supply power to the light emitting diode 49, when transistor 59 turns on. In this manner, the current applied from sampling resistor 39 through emitter resistor 43 to transistor 59 is accounted for in the current being monitored through the sampling resistor, and is not lost in the measurement of the current through conductor 5. In this manner, the accuracy of current measurement is greatly enhanced, insuring that the total current flowing through the monitoring or sampling resistor 39 is the actual current being measured via the light output of the analogous light emitting diode 49. The current flowing through the sampling resistor 39 that is not used by the light emitting diode 49, passes through the zener diode 27.

The current flowing through the light emitting diode 49, causes diode 49 to emit light having an intensity proportional to the magnitude of this current. The fiber optic cable 61 carries this light from the transmitter submodule 21 to the receiver module 69, where the other end of the fiber optic cable 61 is coupled to the photodiode 85 via the fiber optic coupler 67. Photodiode 85 responds to the level of intensity of the light it receives by conducting current to develop a voltage across resistor 87 that is proportional to the magnitude of current flowing through sampling resistor 39, as previously described. Operational amplifier 79 is configured as a current-to-voltage amplifier and is coupled through trimming resistor 93 to output operational amplifier 83, where the signal is amplified and provided as an output signal for application across a volt meter (not shown), for example, that is calibrated for reading out the magnitude of current flowing through the conductor 5.

As previously mentioned, the transmitter submodule 23 is identical to transmitter submodule 21, except that the former measures the magnitude of current flowing in the direction of arrow 7. In other words, current flowing in the direction of arrow 7 enters terminal 17 from conductor 5, flows into submodule 23, in the same manner previously described for current flowing in the direction of arrow 9, entering the current monitor through terminal 15, and flowing into submodule 21. The current, after passing through submodule 23, is returned via conductor 99, through monitoring resistor 19, and out of terminal 15 into conductor 5 The light output signal developed by transmitter submodule 23 is coupled via fiber optic cable 73 to photodiode 89 of the receiver module 69. Photodiode 89 responds to the intensity of the light beam by developing a voltage across resistor 91 which is proportional to the magnitude of current monitored by submodule 23. This voltage is passed through trimming resistor 95 to output amplifier 83. Output amplifier 83 amplifies the trimmed voltage and provides the same as an output voltage for application to the voltage previously described. Note that the trimming resistors 93 and 95 are used to calibrate the system for obtaining an accurate reading of the magnitude of current being monitored.

Figure 2:
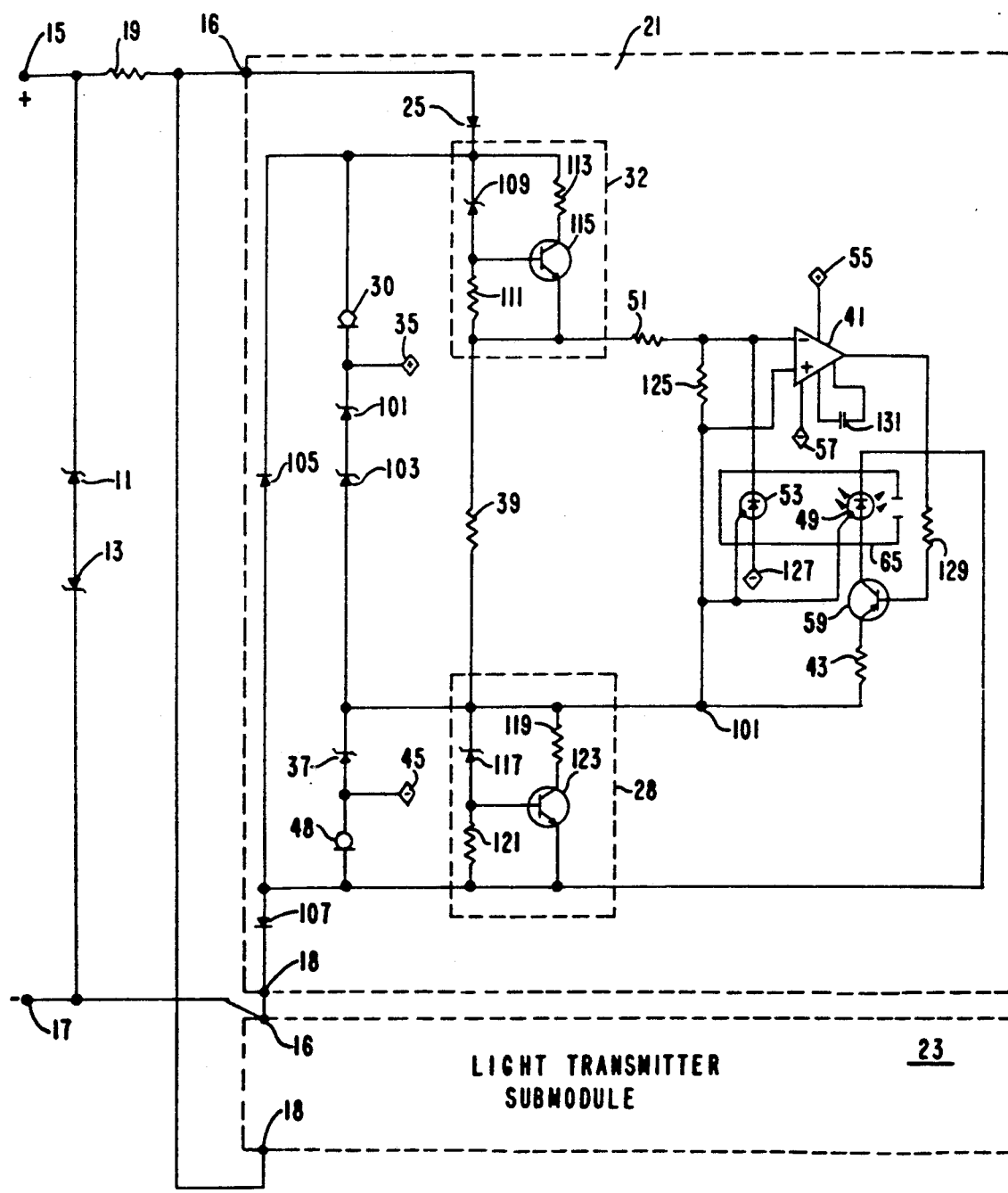
FIG. 2 is a more detailed schematic diagram of a current monitoring transmitter module of an embodiment of the present invention.

With reference to FIG. 2, a more detailed circuit schematic diagram is shown of the transmitter submodule 21. In this embodiment of the invention, zener diode 31 is replaced by a voltage regulator circuit 32 (functionally equivalent to zener diode 31), that includes a zener diode 109 having a cathode electrode connected in common to an anode electrode of a current diode 30, the cathode electrode of diode 25, and one end of collector resistor 113. The anode electrode of zener diode 109 is connected in common to the base electrode of an NPN transistor 115 and one end of base resistor 111. The other end of collector resistor 113 is connected to the collector electrode of transistor 115, the latter having its emitter electrode connected in common to the other end of base resistor 111, one end of sampling resistor 39, and one end of input resistor 51. The other end of current diode 30 is connected to voltage terminal 35 and the cathode electrode of zener diode 101. The anode electrode of zener diode 101 is connected to the cathode electrode of a zene diode 103. Note that current diode 30 serves as current regulator in FIG. 1.

Also, another voltage regulator circuit 28 for providing substantially the same function as zener diode 27 (FIG. 1) includes a zener diode 117 having a cathode electrode connected in common to the other end of sampling resistor 39, to the anode electrode of zener diode 103, the cathode electrode of a zener diode 37, to one end of a collector resistor 119, and to the zero volt node 101. The anode electrode of zener diode 117 is connected in common to one end of a base resistor 121, and the base electrode of an NPN transistor 123. NPN transistor 123 also has a collector electrode connected to the other end of collector resistor 119, an emitter electrode connected in common to the other end of base resistor 121, the cathode electrode of light emitting diode 49, the cathode electrode of current diode 48, and the anode electrodes of blocking diodes 105 and 107. The anode electrode of zener diode 37 is connected in common to the anode electrode of current diode 48 and voltage terminal 45. Note that zener diode 109 is a 4.3 volt zener, zener diode 117 is a 6.8 volt zener, zener diodes 101 and 103 are each 1.2 volt zeners, and zener diode 37 is a 5.1 volt zener. Also note that the photo optical coupler 65 is in this example provided by an ADC part number CAH-XIE-01, manufactured by ADC Fiber Optics, located in Westborough, Mass.

Figure 4:
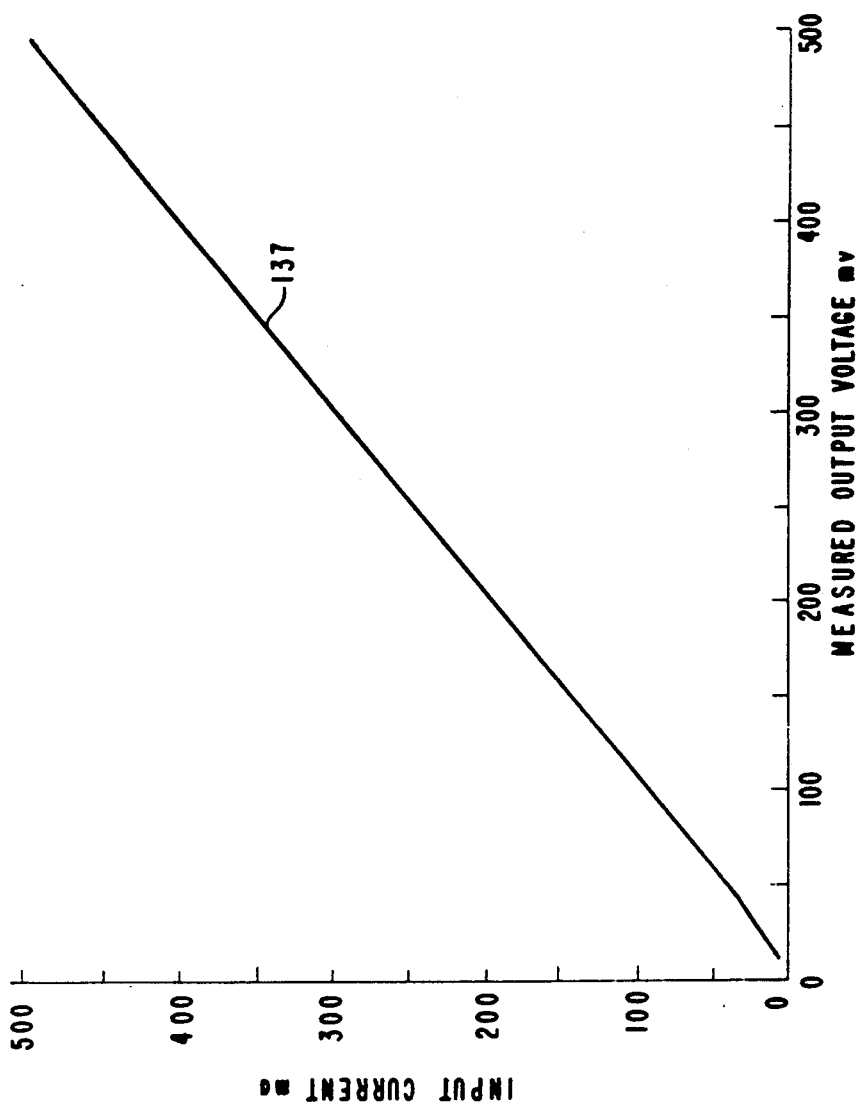
FIG. 4 shows a typical calibration curve for one embodiment of the invention.
Figure 3:
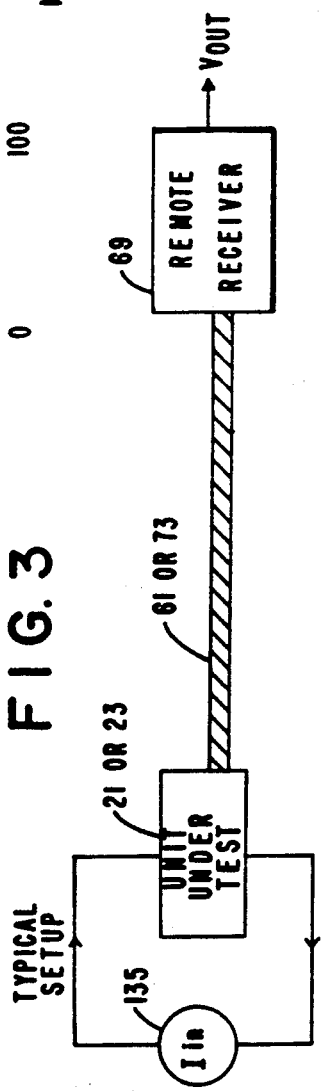
FIG. 3 is a block-schematic diagram of a system for calibrating a current monitor module in one embodiment of the present invention.

In FIG. 3, a simplified block diagram of a calibration test setup is shown. The block entitled "Unit Under Test" is indicative of either one of a transmitter submodule 21 or 23. The current flowing through the main conductor 5 is illustrated as a current source 135. The fiber optic cable connection from the particular one of the units 21 or 23 under test is simulating either one of the fiber optical cables 61 or 73, respectively. The fiber optic cable 61 or 73 is connected to a remote receiver 69, as shown in FIG. 1, in this example. The current source 135 is controlled for causing a predetermined magnitude of current to flow through the main conductor 5 for a given measuring period. The magnitude of current is varied in milliampere steps, in this example, and the output voltage from the receiver 69 is plotted against the known magnitude of current flowing through conductor 5 at a given time. A curve, as shown in FIG. 4, is obtained. This curve is representative of a calibration curve for a particular transmitter submodule 21 or 23. As shown, the curve or graph so obtained is highly linear, and also indicative of a dead band near the zero points on the graph. This dead band represents the necessary magnitude of current to energize the current monitor circuit 21 or 23 under test, in order to permit the transmitter submodule 21 or 23 to begin actual measurement of the magnitude of current flowing through conductor 5. The magnitude of this dead band is insignificant in comparison to the magnitude of current typically being measured. As illustrated in the typical graph or calibration curve of FIG. 4, with respect to a 500.0 milliampere full scale for input current, the dead band represents only about 0.5% of full scale (2.5 milliamperes, in this example).

In the calibration example given, the receiver 69 was adjusted to provide a measured output voltage of about 300.0 millivolts for an input current of 300.0 milliamperes. After adjusting the receiver for providing the latter, the current was then varied in milliampere steps below 300.0 milliamperes down to the dead band region, and above 300.0 milliamperes to the illustrated maximum value of 500.0 milliamperes, in this example. For a given transmitter submodule 21 or 23, similar calibration curves can be developed for providing for a direct conversion of measured output voltage from a receiver 69 to the magnitude of the monitored input current. Alternatively, a voltage meter can be calibrated to provide with minimal error a direct readout of the magnitude of current being monitored, for example.

As previously indicated, because the power for the current monitor circuit 1 is derived from the actual current being monitored, there is a delay in measurement when a particular pulse of current is being measured. In engineering prototypes for the present current monitor, it has been observed that when measuring a 100.0 milliampere pulse of current, the delay time is slightly less than 20.0 microseconds. When monitoring larger magnitudes of current, such as a 600.0 milliampere pulse of current, the delay time to respond is a little more than 10.0 microseconds. Also, in tests where the current monitor circuit 1 had an idle current of a magnitude of about 4.0 milliamperes before measurement of a relatively large pulse of current occurs, a pulse of current of 10.0 milliamperes was responded to within 30.0 microseconds. If the current pulse had a greater magnitude, the circuit response time would have been substantially less. The response time is directly related to the time intervals necessary for charging various parasitic and inherent capacitances within the current monitor 1.

Figure 5:
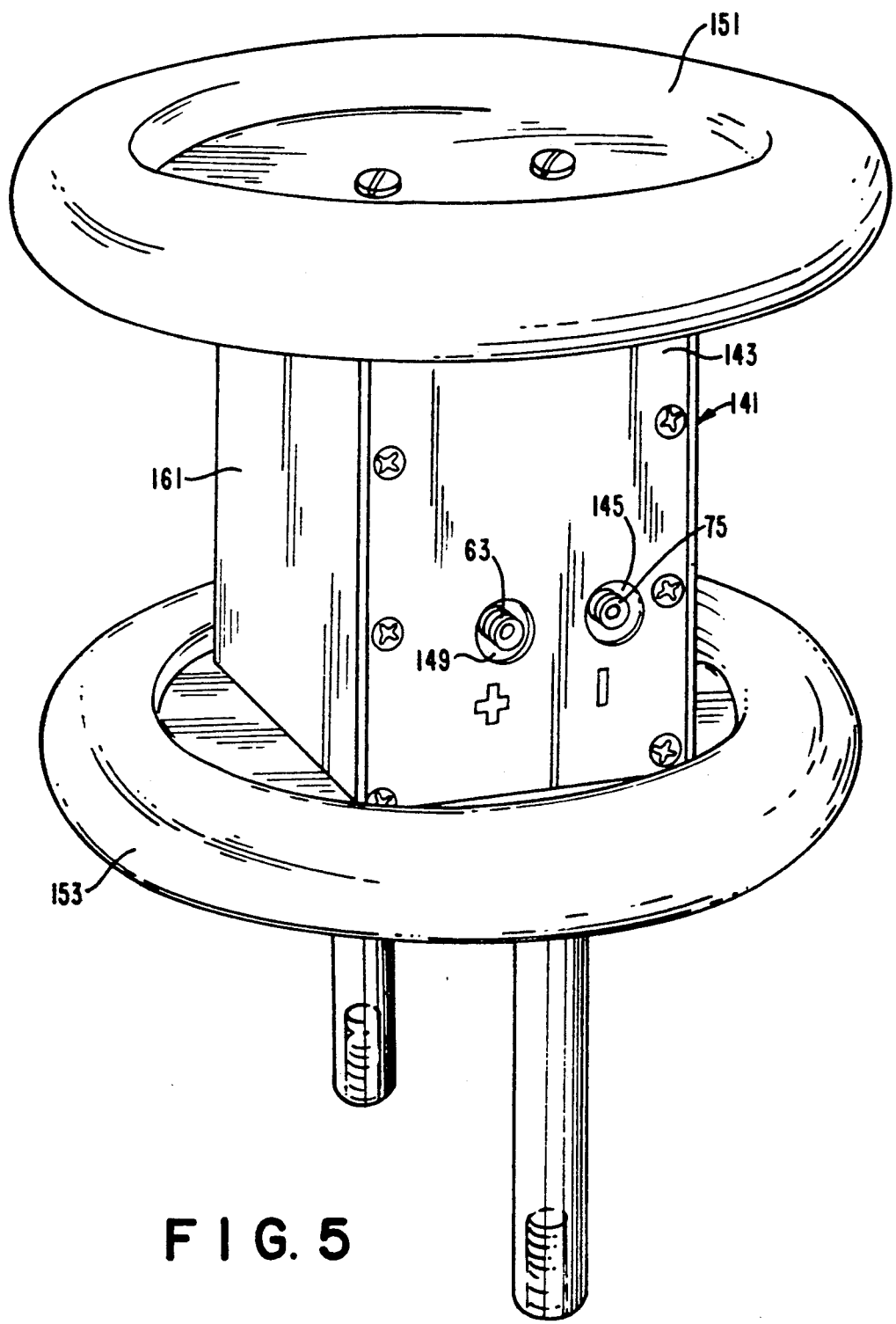
FIG. 5 shows a pictorial illustration from the front of a housing for transmitter module of one embodiment of the invention.

The transmitter module 1 can be contained in a housing 141, as shown in FIG. 5. The housing includes a box-like enclosure 143 having a front panel including a hole 145 for providing access to a fiber optic cable coupler 147, and another hole 149 for providing access to fiber optic coupler 63. The enclosure 143 is mounted between voltage corona rings 151 at the top of the enclosure, and 153 at the bottom of the enclosure 143. A conductor 5 which is to be monitored for current flow is cut, and one cut end is connected to volt terminal 155, and the other end to volt terminal 157 (See FIG. 6). Screws 159 are shown for securing the front and back panels to the main housing 161. Note that the voltage corona rings 151 and 153 are included to prevent voltage arcing, as is common practice in high-voltage systems. Also, the transmitter module is operated, in this example, within a chamber filled with Sulphur Hexafluoride gas (SF$_6$), for reducing high-voltage arcing problems (SF$_6$ has a higher dielectric constant than air).

Although various embodiments of the present invention have been discussed above for purposes of illustration, they are not meant to be limiting, and variations thereof may occur to those of skill in the art, which variations are meant to be covered by the scope and spirit of the appended claims. For example, batteries can be used for providing the operating or supply voltages +V and −V, thereby eliminating voltage regulator circuits 28 and 32, current diodes 30 and 48, and zener diodes 101, 103 and 37.

What I claim is:

1. A current monitor for bidirectionally measuring relatively low magnitudes of current, over a frequency range from zero to above 50 khz, in a conductor across which a relatively high level of voltage is applied, comprising:
    a first transmitter module connected in series with said conductor in an area of relatively high voltage, said first transmitter module including:
        a first terminal for receiving substantially the entire current flowing therethrough in one direction for a first period of time;
        a second terminal for returning said current to said conductor, said conductor being connected across said terminals;
        power supply means connected between said first and second terminals for producing necessary operating voltages from a substantially insignificant portion of the current being monitored, said operating voltages being for supplying power to said first transmitter module;
        current magnitude sampling means connected between said first and second terminals, through which a substantial portion of the current being monitored flows, for producing a sample voltage having a level directly proportional to the magnitude of current being monitored;
        light emitting means for converting a current signal to a light beam having an intensity directly proportional to the magnitude of said current signal; and
        voltage-to-current conversion means connected across said current magnitude sampling means, and receiving said operating voltages from said power supply means, for converting said sample voltage into a current signal for application to one end of said light emitting means, the other end thereof being connected to said second terminal, for producing a first light beam having an intensity directly proportional to the magnitude of the current being monitored; and
    first receiving means located in a safe area remote from the high voltage area in which said first transmitter module is located, said receiving means being responsive to said first light beam produced by said light emitting means for converting said first light beam to a first DC output voltage signal having a level directly proportional to the magnitude of current flowing in said one direction through said conductor.

2. The current monitor of claim 1, further including:
    a second transmitter module substantially identical to said first transmitter module, said second transmitter module having its first and second terminals connected individually to said second and said first terminals, respectively, of said first transmitter module;
    said first terminal of said second transmitter module being adapted for receiving current from said conductor flowing in an opposite direction therethrough, for a second period of time not overlapping or related to said first period of time;
    said second terminal of said second transmitter module being adapted for returning current flowing in the opposite direction to said conductor;
    said light emitting means of said second transmitter module producing a second light beam having an intensity directly proportional to the magnitude of the oppositely flowing current being monitored; and
    second receiving means located in said safe area remote from said high voltage area, responsive to said second light beam for converting said light beam to a second DC output voltage signal having a level directly proportional to the magnitude of current flowing in the opposite direction through said conductor.

3. The current monitor of claim 1, wherein said power supply includes:
    a first blocking diode having an anode electrode connected to said first terminal, and a cathode electrode;
    first voltage reference means connected between the cathode electrode of said first blocking diode and one end of said current magnitude sampling means, for producing a first predetermined positive level of DC voltage at its connection with said first blocking diode;
    a second voltage reference means connected between the other end of said current magnitude sampling means and said second terminal, for producing a second predetermined positive level of DC voltage at its connection with said current magnitude sampling means;

a third terminal at which a positive DC operating voltage is developed;

a first current regulator connected between said third terminal and the common connection between said first blocking diode and first voltage reference means;

a first zener diode having a cathode electrode connected to said third terminal, and an anode electrode connected to the common connection between said current magnitude sampling means and said second voltage reference means, the voltage developed across said first zener diode being said positive DC operating voltage;

a fourth terminal at which a negative DC operating voltage is developed;

a second current regulator connected between said fourth terminal and said second terminal; and a second zener diode having a cathode electrode connected to the common connection between said current magnitude sampling means and said second voltage reference means, the voltage developed across said second zener diode being said negative DC operating voltage.

4. The current monitor of claim 3, wherein said power supply means further includes:

a third zener diode for said first voltage reference means, having a cathode electrode connected to the cathode electrode of said first blocking diode, and an anode electrode connected to said one end of said current magnitude sampling means; and a fourth zener diode for said second voltage reference means, having a cathode electrode connected to the other end of said current magnitude sampling means, and an anode electrode connected to said second terminal.

5. The current monitor of claim 1, wherein said current magnitude sampling means consists of a relatively low value resistor, across which said sample voltage is developed.

6. The current monitor of claim 1, wherein said voltage-to-current conversion means includes:

an input resistor having one end connected to the common connection between said current magnitude sampling means and said first terminal;

an operational amplifier having an inverting terminal connected to the other end of said input resistor, a noninverting terminal connected to the common connection between said current magnitude sampling means and said second terminal, a pair of terminals for receiving operating voltages, respectively, from said power supply means, and an output terminal;

said light emitting means consisting of a light emitting diode (LED) having cathode and anode electrodes, the cathode electrode being connected to said second terminal;

a bipolar transistor having a base electrode connected to the output terminal of said operational amplifier, a collector electrode connected to the anode electrode of said LED, and an emitter electrode; and an emitter resistor connected between the non-inverting terminal of said operational amplifier and said emitter electrode of said bipolar transistor.

7. The current monitor of claim 6, wherein said voltage-to-current conversion means further includes:

a photodiode located proximate said LED, and having a cathode electrode connected to the common connection between said input resistor and the inverting terminal of said operational amplifier, said photodiode being responsive to said first light beam for providing linear feedback to said operational amplifier, for substantially insuring the intensity of said first light beam is linearly proportional to the magnitude of current flowing through said conductor.

8. A current monitor for bidirectionally measuring relatively low magnitudes of current, over a frequency range from zero to above 50 khz, in a conductor across which a relatively high level of voltage is applied, comprising:

a first transmitter module connected in series with said conductor in an area of relatively high voltage, said first transmitter module including:

a first terminal for receiving substantially the entire current flowing therethrough in one direction for a first period of time;

a second terminal for returning said current to said conductor, said conductor being connected across said terminals;

power supply means connected between said first and second terminals for producing necessary operating voltages from a substantially insignificant portion of the current being monitored, said operating voltages being for supplying power to said first transmitter module;

current magnitude sampling means connected between said first and second terminals, through which a substantial portion of the current being monitored flows, for producing a sample voltage having a level directly proportional to the magnitude of current being monitored;

light emitting means for converting a current signal to a light beam having an intensity directly proportional to the magnitude of said current signal; and voltage-to-current conversion means connected across said current magnitude sampling means, and receiving said operating voltages from said power supply means, for converting said sample voltage into a current signal for application to one end of said light emitting means, the other end thereof being connected to said second terminal, for producing a first light beam having an intensity directly proportional to the magnitude of the current being monitored;

first receiving means located in a safe area remote from the high voltage area in which said first transmitter module is located, said receiving means being responsive to said first light beam produced to said light emitting means for converting said first light beam to a first DC output voltage signal having a level directly proportional to the magnitude of current flowing in said one direction through said conductor; and a second transmitter module substantially identical to said first transmitter module, said second transmitter module having its first and second terminals connected individually to said second and said first terminals, respectively, of said first transmitter module;

said first terminal of said second transmitter module being adapted for receiving current from said conductor flowing in an opposite direction therethrough, for a second period of time not overlapping or related to said first period of time;

said second terminal of said second transmitter module being adapted for returning current flowing in the opposite direction to said conductor;

said light emitting means of said second transmitter module producing a second light beam having an intensity directly proportional to the magnitude of the oppositely flowing current being monitored; and second receiving means located in said safe area remote from said high voltage area, responsive to said second light beam for converting said light beam to a second DC output voltage signal having a level directly proportional to the magnitude of current flowing in the opposite direction through said conductor.

9. The current monitor of claim 8, wherein said first receiving means includes:

a first fiber optic cable optically coupled at one end to said light emitting means of said first transmitter module;

a source of reference potential;

a first operational amplifier having an inverting terminal connected to said source of reference potential, a non-inverting terminal, and an output terminal;

a first photodiode having anode and cathode electrodes connected between said inverting and non-inverting terminals of sad first operational amplifier, respectively, the other end of said first fiber optic cable being optically coupled to said first photodiode;

a first feedback resistor connected between said inverting and output terminals of said first operational amplifier, respectively;

a second operational amplifier having an inverting terminal, a non-inverting terminal connected to said source of reference potential, and an output terminal at which said first DC output voltage signal is developed;

a first input resistor connected between the output and inverting terminals of said first and second operational amplifiers, respectively; and a second feedback resistor connected between the inverting and output terminals of said second operational amplifier.

10. The current monitor of claim 7, wherein said second receiving means includes:

a second fiber optic cable optically coupled at one end to said light emitting means of said second transmitter module;

a third operational amplifier having a non-inverting terminal connected to said source of reference potential, an inverting terminal, and an output terminal;

a second photodiode optically coupled to the other end of said second fiber optic cable, having a cathode electrode connected to the inverting terminal of said third operational amplifier, and an anode electrode connected to said source of reference potential; and a second input resistor connected between the output and inverting terminals of said third and second operational amplifiers, respectively;

said second DC output voltage signal being developed at the output terminal of said second operational amplifier.

11. The current monitor of claim 8, further including:

a monitoring resistor having one end connected to one end of said conductor, and said monitoring resistor having its other end connected in common to the first and second terminals of said first and second transmitter modules, respectively; and a pair of series connected Transorbs having commonly connected anode electrodes, one of said pair having a cathode electrode connected to said one end of said conductor, the other of said pair having a cathode electrode connected in common to another end of said conductor, and the second and first terminals of said first and second transmitter modules, respectively, for providing overcurrent protection.

12. The current monitor of claim 8, further including:

overcurrent protection means connected across said first and second terminals of said first and second transmitter modules, for shunting currents having magnitudes exceeding a predetermined magnitude away from said first and second modules.

13. The current monitor of claim 3, further including:

said first current source consisting of a current diode having an anode electrode connected to the common connection between said first blocking diode and first voltage reference means, and a cathode electrode connected to said third terminal; and said second current source consisting of a current diode having an anode electrode connected to said fourth terminal, and a cathode electrode connected to said second terminal.

14. The current monitor of claim 3, wherein said first voltage reference means includes:

a third zener diode having a cathode electrode connected to the cathode electrode of said first blocking diode, and an anode electrode;

a first bipolar transistor having a base, collector, and emitter electrodes;

a base resistor connected in common at one end to the base electrode of said first bipolar transistor and the anode electrode of said third zener diode, and connected in common at its other end to said one end of said current magnitude sampling means and said emitter electrode; and a collector resistor connected between said collector electrode and the common connection between the cathode electrodes of said first blocking diode and third zener diode, respectively.

15. The current monitor of claim 14, wherein said second voltage reference means includes:

a fourth zener diode having a cathode electrode connected to the other end of said current magnitude sampling means, and an anode electrode;

a second bipolar transistor having a base, collector, and emitter electrodes;

a base resistor connected in common at one end to the base electrode of said second bipolar transistor, and the anode electrode of said fourth zener diode, and connected in common at its other end to the emitter electrode of said second bipolar transistor and said second terminal; and a collector resistor connected between said collector electrode and the common connection between the other end of said current magnitude sampling means and cathode electrode of said fourth zener diode.

16. The current monitor of claim 3, wherein said second voltage reference means includes:

a third zener diode having cathode electrode connected to the other end of said current magnitude sampling means, and an anode electrode;

a first bipolar transistor having a base, collector, and emitter electrodes;

a base resistor connected in common at one end to the base electrode of said first bipolar transistor and the anode electrode of said third zener diode, and connected in common at its other end to said emitter electrode of said first bipolar transistor and said second terminal; and a collector resistor connected between said collector electrode and the common connection between the other end of said current magnitude sampling means and cathode electrode of said third zener diode.

17. A current monitor for bidirectionally measuring relatively low magnitudes of current, over a frequency range from zero to above 50 khz, in a conductor across which a relatively high level DC voltage is applied, comprising:

power supply means connected between said first and second terminals for producing necessary operating voltages from a substantially insignificant portion of the current being monitored, said operating voltages being for supplying power to said first transmitter module;

a first transmitter module connected in series with said conductor in an area of relatively high voltage, said first transmitter including:

a first terminal for receiving substantially the entire current flowing therethrough in one direction for a first period of time;

a second terminal for returning said current to said conductor, said conductor being connected across said terminals;

current magnitude sampling means connected between said first and second terminals, through which a substantial portion of the current being monitored flows, for producing a sample voltage having a level directly proportional to the magnitude of current being monitored;

light emitting means for converting a current signal to a light beam having an intensity directly proportional to the magnitude of said current signal; and voltage-to-current conversion means connected across said current magnitude sampling means, and receiving said operating voltages from said power supply means, for converting said sample voltage into a current signal for application to one end of said light emitting means, the other end thereof being connected to said second terminal, for producing a first light beam having an intensity directly proportional to the magnitude of the current being monitored;

a second transmitter module substantially identical to said first transmitter module, said second transmitter module having its first and second terminals connected individually to said second and said first terminals, respectively, of said first transmitter module;

said first terminal of said second transmitter module being adapted for receiving current from said conductor flowing in an opposite direction therethrough, for a second period of time not overlapping or related to said first period of time;

said second terminal of said second transmitter module being adapted for returning current flowing in the opposite direction to said conductor;

said light emitting means of said second transmitter module producing a second light beam having an intensity directly proportional to the magnitude of the oppositely flowing current being monitored; and first receiving means located in a safe area remote from the high voltage area in which said first transmitter module is located, said receiving means being responsive to said first light beam produced by said light emitting means for converting said first light beam to a first DC output voltage signal having a level directly proportional to the magnitude of current flowing in said one direction through said conductor; and second receiving means located in said safe area remote from said high voltage area, responsive to said second light beam for converting said light beam to a second DC output voltage signal having a level directly proportional to the magnitude of current flowing in the opposite direction through said conductor.

18. The current monitor of claim 17, further including power supply means connected between first and second terminals for supplying necessary power to said first and second transmitter modules, by converting a substantially insignificant portion of the current being monitored into required operating voltages.

19. The current monitor of claim 17, further including in each one of said first and second transmitter modules, power supply means connected between said first and second terminals thereof, respectively, for converting a substantially insignificant portion of the current being monitored into required operating voltages.

* * * * *

UNITED STATES PATENT AND TRADEMARK OFFICE
CERTIFICATE OF CORRECTION

PATENT NO. : 5,107,202
DATED     : April 21, 1992
INVENTOR(S) : George F. Renda

It is certified that error appears in the above-identified patent and that said Letters Patent is hereby corrected as shown below:

Column 7, line 33, after "voltage" insert --meter--.

Column 7, line 56, change "zene" to --zener--.

Column 9, line 31, after "module" insert --1--.

Col. 13, claim 10, line 1, change "7" to --8--.

Signed and Sealed this

Twenty-fourth Day of August, 1993

Attest:

BRUCE LEHMAN

*Attesting Officer*   *Commissioner of Patents and Trademarks*